Dec. 29, 1964 A. L. KEMPER 3,163,826

FREQUENCY MODULATION DETECTOR HAVING A LINEAR SLOPE OUTPUT

Filed July 2, 1962

INVENTOR.
Arthur L. Kemper
BY
Moody and Kintzinger
Attorneys 3,163,826
Patented Dec. 29, 1964

3,163,826

FREQUENCY MODULATION DETECTOR HAVING A LINEAR SLOPE OUTPUT

Arthur L. Kemper, Cedar Rapids, Iowa, assignor to Collins Radio Company, Cedar Rapids, Iowa, a corporation of Iowa Filed July 2, 1962, Ser. No. 206,913
7 Claims. (Cl. 329—103)

Figure 1:
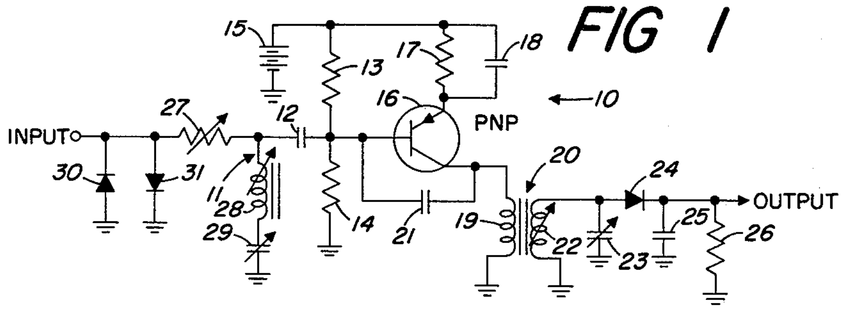

This invention relates in general to frequency modulation detectors, and in particular to a solid state frequency modulation detector circuit having a linear output characteristic with low impedance operation.

There are many frequency modulation detectors or discriminators presently in use having nonlinear output characteristics and with outputs limited to relatively low voltage levels. The nonlinearity of output presents undesired distortion, and low voltage output levels increase any amplification requirements through following equipment. This results in amplification of undesired distortion and increases noise. Further, many discriminators, being high impedance circuits, are limited from use in low impedance operation. Some detectors that have been devised for low impedance operation require many components, impose undesired maintenance, are more costly, and have still presented a nonlinear slope output.

It is, therefore, a principal object of this invention to provide an improved low impedance solid state frequency modulation detector having a substantially linear slope output characteristic.

A further object is to provide such operation with an FM detector operating at relatively high efficiency with relatively high output voltage while requiring fewer components than used with many FM detectors or discriminators.

Features of this invention useful in accomplishing the above objects are the use of a multielement solid state device, such as a transistor, in a frequency modulation detector also having a frequency conscious voltage divider interposed along with a capacitor in the signal path to the base of the transistor. The frequency conscious voltage divider includes a resistor in the signal path and a series resonant circuit connected between the signal path and ground. Of course, a resistive network and a D.C. supply are provided for obtaining bias voltages between elements of the transistor in a conventional manner. The collector output of the transistor is coupled through a transformer, having an untuned primary coil and a secondary coil circuit adjustably tuned to a carefully selected lower resonant frequency than the desired FM detector operating center frequency, to a discriminator circuit diode and capacitor network for providing the desired discriminator slope output. Additional signal limiting diodes may be connected between the signal path and ground for limiting the input signal voltage levels fed to the discriminator, in effect, minimizing or substantially eliminating any amplitude modulation present.

Specific embodiments representing what are presently regarded as the best modes of carrying out the invention are illustrated in the accompanying drawing.

Figures 2, 3:
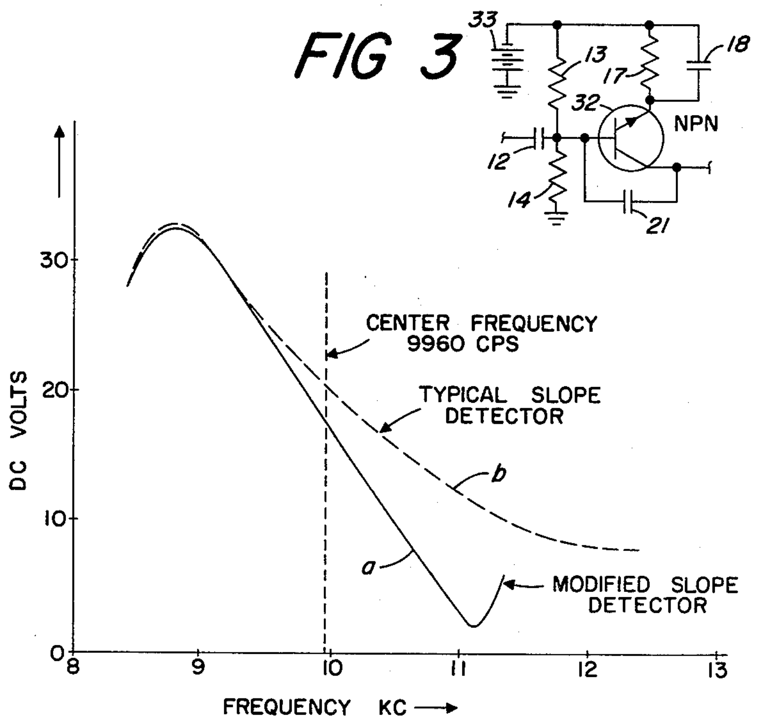

In the drawing:

FIGURE 1 represents a frequency modulation detector circuit utilizing a PNP transistor, a frequency conscious voltage divider in the signal input path to the base of the transistor, and a diode and capacitor network in the transistor collector output portion of the detector;

FIGURE 2, a D.C. voltage output-to-frequency input comparison between the output characteristic curve of a detector having a nonlinear slope output and the substantially linear slope output curve provided by one of my improved detectors; and FIGURE 3, a frequency modulation detector similar to the detector of FIGURE 1 with, however, an NPN transistor replacing the PNP transistor of FIGURE 1 and with the battery polarity reversed from the battery of FIGURE 1.

Referring to the drawing:

The linear slope detectors shown each employ one multielement solid state device such as a transistor, and one diode in the output portion of the detector. The input signal path of each of these detectors serially includes a frequency conscious voltage divider, a capacitor, and a connection through a D.C. voltage divider resistive network to the base of the transistor. The collector output circuit of the transistor is coupled through a transformer coupling, having an untuned primary and a tuned secondary coil circuit, to a diode equipped frequency rectifying signal detecting output circuit. The transformer secondary coil circuit is tuned to a different resonant frequency than the desired FM detector center frequency. The frequency conscious voltage divider includes a resistor in the signal path and a series resonant circuit connected between the signal path and ground. This frequency conscious voltage divider, with properly adjusted Q and with the series resonant circuit adjusted to a frequency suitably different than the frequency of the transformer secondary coil circuit, has such an effect upon the signal as to help make the detector slope output substantially linear. Each detector embodiment, using only one transistor and one diode, is capable of providing amplification, particularly with a step-up ratio employed through the transformer coupling, to the extent that a detected signal, for example a 30 cycle signal, is greater than that which can be obtained by a transformerless transistor amplifier operating with the same low voltage D.C. supply.

The FM detector 10 of FIGURE 1 is shown to have an input signal path connected serially through a frequency conscious voltage divider 11, a direct current blocking capacitor 12, and the junction between resistors 13 and 14, which form a D.C. voltage divider connected between the positive end of battery 15 and ground, to the base of PNP transistor 16. The positive side of the battery 15 is also connected through resistor 17 and parallel capacitor 18, a feedback impedance raising capacitor, to the emitter of transistor 16 for obtaining transistor emitter-to-base bias in a conventional manner. The transistor collector is connected to ground through the primary coil 19 of transformer coupling 20. This not only provides signal coupling means to following circuitry but with the collector connection to ground base-to-collector bias is determined by the D.C. voltage level of the junction between voltage divider resistors 13 and 14. Capacitor 21, which is connected between the base and the collector of transistor 16, provides negative signal feedback, and also lowers output impedance of the transistor to the primary coil 19 of coupling transformer 20.

The secondary coil 22, of transformer 20, may have more turns than primary coil 19 to advantageously provide a step-up ratio through the transformer, and is connected in parallel with capacitor 23 between ground and the anode of diode 24. The cathode of diode 24, which provides a detector rectifying action, is connected in parallel through capacitor 25 and resistor 26 to ground and is also connected for feeding output to following equipment (not shown). The frequency conscious voltage divider 11 includes variable resistor 27 in series with the signal input path, and adjustable coil 28 serially connected with adjustable capacitor 29 between the signal input path and ground.

A pair of limiting diodes 30 and 31 may be connected in parallel between the signal input path and ground, one with cathode to signal path and the other one cathode to ground, for eliminating any amplitude modulation present. It should be realized that for some installations my FM detectors could provide successful operation without one, or both capacitors 18 and 21, and without the signal amplitude modulation limiting diodes 30 and 31.

The detector rectifying action of diode 24 in cooperation with transformer secondary coil 22, capacitor 23, capacitor 25 and resistor 26 provides, for the FM detectors shown, a D.C. voltage to frequency output having a linear slope output characteristic (see curve (*a*) in FIGURE 2). The dotted curve (*b*) in FIGURE 2 illustrates the slope output characteristic that would be obtained if the FM input signal were fed directly through capacitor 12 to the base of the transistor 16 without the frequency conscious voltage divider 11 being present in the signal input path. The dotted curve (*b*) also represents a slope detector curve shape normally to be expected with many existing FM detectors which, however, for the same biasing voltage value applied to the transistor would not provide as high detector output voltages without a step-up ratio through a coupling transformer such as provided out of transistor 16.

In order to provide a linear slope output characteristic curve sloping as typified by curve (*a*) in FIGURE 2 the transformer secondary coil 22 circuit is tuned to a lower resonant frequency than the desired FM detector operational center frequency and the series LC circuit, in the frequency sensitive voltage divider 11, is tuned to a higher frequency than transformer secondary coil 22 circuit. In order to obtain a linear slope output characteristic curve having the opposite slope to that of curve (*a*) of FIGURE 2, the secondary coil 22 circuit is tuned to a higher resonant frequency than the desired FM detector operational center frequency and the series LC circuit of the frequency sensitive voltage divider is tuned to a lower frequency than the tuned frequency of the secondary coil 22 circuit.

Generally, the transformer coupling secondary coil is tuned to a carefully selected different resonant frequency than the desired FM detector operational center frequency while the primary coil remains untuned. Then, properly related adjustment of Q and the tuned resonant frequency of the series LC circuit in a frequency sensitive voltage divider, located in the signal input path to the transistor, and appropriate adjustment of a resistor for proper voltage divider action make the slope output of the detector substantially linear. These adjustments are so coordinated, and with the LC circuit tuned to a suitably different frequency than the tuned frequency of the transformer secondary coil circuit, that the desired FM detector center frequency will fall approximately in the mid-region of the operational substantially linear portion of the slope output characteristic curve. Further, the slope of the linear slope output characteristic curve may be changed as desired by suitable Q adjustments in both the frequency sensitive voltage divider and the transformer secondary coil circuit. It is particularly significant that the series LC circuit, of the frequency sensitive voltage divider, is substantially isolated from the parallel transformer secondary circuit by the transistor itself. This permits tuning of the two tuned circuits to respective frequencies at a desired operational frequency spacing with a minimum of cross interference and frequency variance.

Linear slope output characteristic curve (*a*) of FIGURE 2 has been provided by the detector of FIGURE 1 when adjusted for operation about a center frequency of 9,960 cycles per second. In order to provide this output the transformer secondary coil 22 circuit was tuned to a resonance at approximately 8,800 cycles per second, a lower frequency than the center frequency. At the same time, properly related adjustment of Q is made and the series LC circuit, between the signal input path and ground, is tuned to a suitably higher resonant frequency than 8,800 cycles per second. In addition, appropriate adjustment of resistor 27 for proper voltage divider action, in the frequency sensitive voltage divider 11, along with the frequency adjustments set forth above makes the slope output of the detector substantially linear. Although this illustrates use of the FM detector of FIGURE 1 in the audio frequency range, a relatively low frequency range, such FM detectors may be used high in the radio frequency range.

Components used in a frequency modulation detector providing the linear slope output characteristic represented by curve (*a*) in FIGURE 2 include the following:

| | |
|---|---|
| Capacitor **12** | 0.47 μf. |
| Resistor **13** | 3.3K ohms. |
| Resistor **14** | 3.3K ohms. |
| D.C. voltage supply **15** | 16 volts. |
| PNP transistor **16** | 2N1184. |
| Resistor **17** | 3.3K ohms. |
| Transformer coil **19** | 200 turns. |
| Transformer coil **22** | Adjusted to 600 turns. |
| Capacitor **23** | Adjusted to 0.0155 μf. |
| Diode **24** | 1N457. |
| Capacitor **25** | 0.1 μf. |
| Resistor **26** | 100K ohms. |
| Resistor **27** | Adjusted to 1K ohm. |
| Coil **28** | Adjusted to 500 turns. |
| Capacitor **29** | Adjusted to 0.01885 μf. |
| Diodes **30** and **31** | 1N457. |

In the embodiment of FIGURE 3, NPN transistor 32 replaces the PNP transistor 16 of FIGURE 1 and battery 33 is reversed from the battery 15 of FIGURE 1 for proper voltage biasing. Other components of the FIGURE 3 embodiment are the same as in the FIGURE 1 embodiment and performance characteristics are substantially the same.

Whereas this invention is here illustrated and described with respect to several embodiments thereof, it should be realized that various changes may be made without departing from the essential contributions to the art made by the teachings hereof.

I claim:

1. A frequency modulation detector having a solid state signal amplifying section; a diode signal rectifying output section; a transformer coupling connecting the solid state amplifying section and the diode signal rectifying output portion; a secondary coil of said transformer coupling being part of a tuned circuit; signal input means providing a signal input path to the solid state amplifying portion of the detector; a tuned LC circuit connected to said signal input means; said secondary coil tuned circuit being tuned to a frequency spaced from the desired center frequency, the tuned LC circuit being tuned to a different frequency than the tuned frequency of the secondary coil circuit and in the same direction from the tuned frequency of the secondary coil circuit as the desired center frequency; the Q of the secondary coil circuit being chosen for a desired degree of slope in the output characteristic curve; the tuned frequency of the secondary coil tuned circuit being carefully selected to bring the output characteristic curve into proper operational relation to the desired center frequency; the Q and the tuned frequency of said tuned LC circuit being so selected that the effect on the input signal to the solid state amplifying section results in a rectified signal output from the detector having a substantially linear sloped output characteristic curve properly positioned about the chosen center frequency and at the desired degree of slope; wherein said secondary coil tuned circuit includes a capacitor as well as the secondary coil at least one of which is adjustable; and wherein, said tuned LC circuit is part of a frequency sensitive voltage divider including, a resistor in series with the input signal path, and in the LC circuit a coil and a capacitor connected in series between the signal input path and ground; and at least one of the components of said frequency conscious voltage divider being adjustable.

2. The frequency modulation detector of claim 1 wherein, both the Q and the tuned frequency of both the secondary coil tuned circuit and the frequency conscious voltage divider may be adjusted for providing a substantially linear sloped output characteristic curve about a selected center frequency and at the degree of slope desired through a broad range of frequency choices and a broad range of slopes.

3. In a frequency modulation detector including a multielement solid state device, a diode, and a coupling transformer positioned in a signal path between the solid state device and the diode; signal input means connected to a first element of said solid state device; voltage circuit means connected for applying bias between said first element and a second element of said solid state device and for applying bias between said first element and a voltage reference level; a third element of said solid state device being connected to the primary coil of said coupling transformer and through the primary coil to said voltage reference level; a coupling transformer secondary coil connected in parallel with a capacitor between said diode and said voltage reference level; said diode having circuit output means connected through a second capacitor and a parallel connected resistor to said voltage reference level; a frequency sensitive voltage divider including a series resistor in said signal input means, and a series resonant coil-and-capacitor circuit connected between said signal input means and said voltage reference level; and direct current blocking means in said signal input means between said frequency sensitive voltage divider and the solid state device.

4. The frequency modulation detector of claim 3 wherein, said multielement solid state device is a transistor, said secondary coil and its parallel capacitor forming a resonant tuned circuit; means for tuning said secondary coil resonant tuned circuit; and means for tuning said series resonant coil and capacitor circuit.

5. The frequency modulation detector of claim 4 wherein said multielement solid state device is a PNP transistor; and said voltage reference level is ground.

6. The frequency modulation detector of claim 5 wherein said multielement solid state device is a PNP transistor; and said voltage reference level is ground.

7. The frequency modulation detector of claim 3 wherein, said voltage reference level is ground; said solid state device is a transistor; said frequency sensitive voltage divider includes both Q and frequency adjusting means; and said secondary coil and the parallel capacitor comprising a tuned secondary coil circuit; and means for adjusting both Q and frequency of said tuned secondary coil circuit.

References Cited in the file of this patent

UNITED STATES PATENTS

| | | |
|---|---|---|
| 1,708,573 | Hartmann et al. | Apr. 9, 1929 |
| 2,918,577 | Casey | Dec. 22, 1959 |
| 2,975,274 | Mitchell | Mar. 14, 1961 |

UNITED STATES PATENT OFFICE

CERTIFICATE OF CORRECTION

Patent No. 3,163,826 December 29, 1964

Arthur L. Kemper

It is hereby certified that error appears in the above numbered patent requiring correction and that the said Letters Patent should read as corrected below.

Column 6, line 13, for "PNP" read -- NPN --.

Signed and sealed this 4th day of May 1965.

(SEAL)
Attest:

ERNEST W. SWIDER
Attesting Officer

EDWARD J. BRENNER
Commissioner of Patents